United States Patent [19]
Lee

[11] Patent Number: 5,811,856
[45] Date of Patent: Sep. 22, 1998

[54] LAYOUT OF ESD INPUT-PROTECTION CIRCUIT

[75] Inventor: Jian-Hsing Lee, Hsin-Chu, Taiwan

[73] Assignee: Taiwan Semiconductor Manufacturing Company, Ltd., Hsin-Chu, Taiwan

[21] Appl. No.: 554,994

[22] Filed: Nov. 13, 1995

[51] Int. Cl.⁶ .................................................. H01L 23/62
[52] U.S. Cl. ....................... 257/355; 257/361; 257/360; 257/363
[58] Field of Search ................................ 257/355, 361, 257/362, 360, 363

[56] References Cited

U.S. PATENT DOCUMENTS

| | | | |
|---|---|---|---|
| 5,140,401 | 8/1992 | Ker et al. | 357/43 |
| 5,151,767 | 9/1992 | Wong | 257/355 |
| 5,182,220 | 1/1993 | Ker et al. | 437/34 |
| 5,623,156 | 4/1997 | Watt | 257/355 |

OTHER PUBLICATIONS

"A Low Voltage Triggering SCR for Chip ESD Protection at Output & Input Pads" by Chitterjee et al, IEEE 1990, Symposium on VLSI Tech. pp. 75–76.

"ESD Protection for Submicron CMOS Circuits, Issues and Solutions", by Rountree in 1988 IEDM Technical Digest, pp. 580–583.

Primary Examiner—David B. Hardy
Attorney, Agent, or Firm—George O. Saile; Stephen B. Ackerman

[57] ABSTRACT

An object of this invention is the creation of an input protection circuit for highly dense integrated circuits that has improved ESD immunity. This is accomplished by the addition of a P⁺ diffusion adjacent to the emitter of a field device to make the base resistance of each of the field devices approximately equal. When an ESD source is contacted to the input protection circuit, the field devices will conduct simultaneously and with equal currents, thus preventing high current densities that can cause circuit failure.

19 Claims, 2 Drawing Sheets

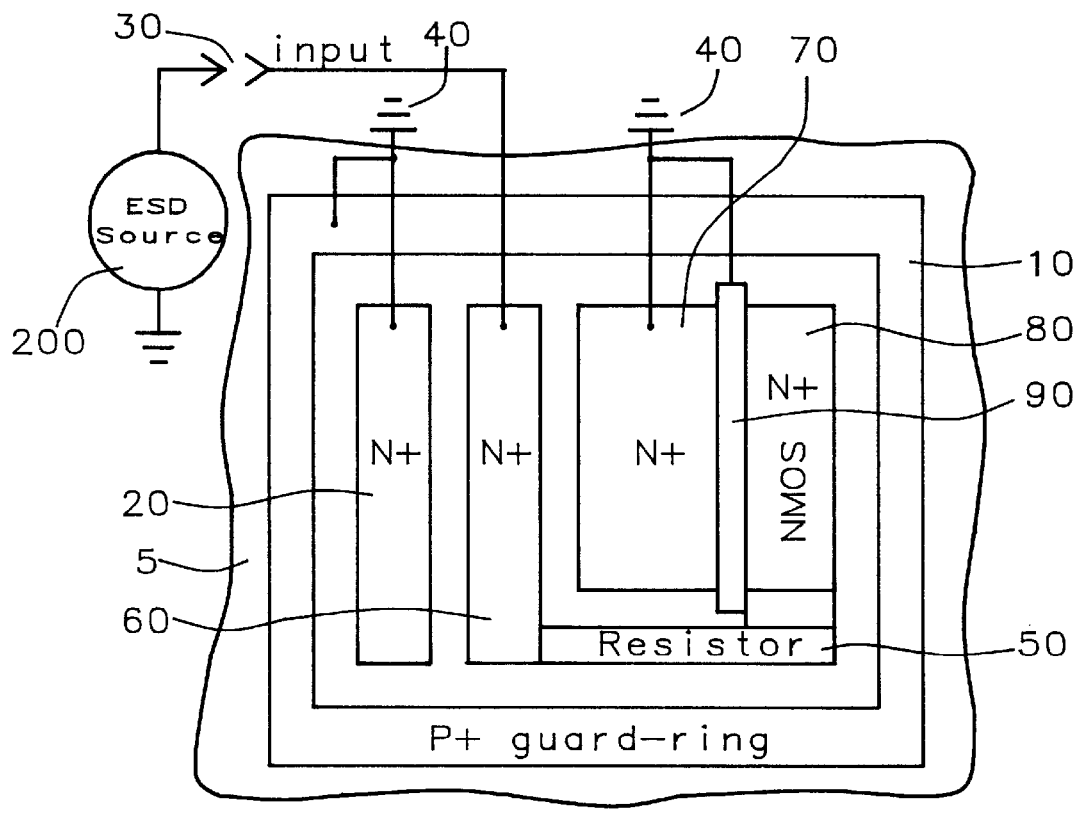
FIG. 1A – Prior Art
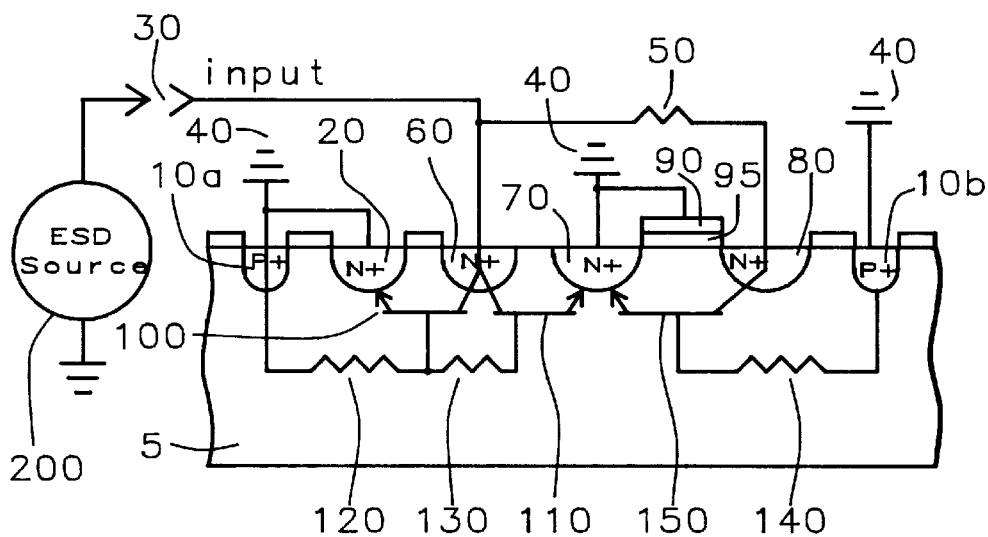
FIG. 1B – Prior Art

LAYOUT OF ESD INPUT-PROTECTION CIRCUIT

BACKGROUND OF THE INVENTION

1. Field of the Invention

This invention relates to the design of Electrostatic Discharge (ESD) protection circuits for integrated circuits, especially, those factors of the design that relates to the improvement of the immunity of integrated circuits to ESD.

2. Description of the Related Art

Referring to FIGS. 1a and 1b a P$^+$ diffusion forms a rectangular guardring 10 around the area that defines the input protection circuit on a P-type substrate 5. The guardring 10 is connected to a ground reference potential 40.

A first N$^+$ diffusion 20 has a rectangular shape and is placed in close proximity to one side of the guardring 10. The N$^+$ diffusion 20 forms the emitter of the field device 100. A second N$^+$ diffusion 60 is placed a distance that is the base width of the field device 100 from the first N$^+$ diffusion 20. This second N$^+$ diffusion 60 forms the collector of the field device 100. The base of the field device 100 is the P type substrate 5 that is between the first N$^+$ diffusion 20 and the second N$^+$ diffusion 60.

The emitter of the field device 100 (the first N$^+$ diffusion 20) is connected to the ground reference potential 40 and the collector of the field device 100 (the second N$^+$ diffusion 60) is connected to the input terminal 30. The resistance 120 is formed by the bulk resistance of the P-type substrate 5 from the base of the field device 100 to the P$^+$ diffusion 10a of the guardring.

A third N$^+$ diffusion 70 is placed a distance that is the base width of the field device 110 from the second N$^+$ diffusion 60. The second N$^+$ diffusion 60 also forms the collector of the field device 110. The collector of field device 110 is also connected to the input 30. The resistance 120 is formed by the bulk resistance of the P-type substrate 5 from the base of the field device 110 to the base of the field device 100. The third N$^+$ diffusion 70 (the emitter of the field device 110) is connected to the ground reference potential 40.

The third N$^+$ diffusion 70 also forms the source of an NMOS FET and the emitter of a parasitic bipolar junction transistor (BJT) 150. The polysilicon layer 90 that forms the gate of the NMOS FET is placed adjacent to the third N$^+$ diffusion 70 and is isolated from the P-type substrate 5 by and insulating material 95 such as silicon dioxide. The gate 90 of the NMOS FET is connected to the ground reference potential 40.

A fourth N$^+$ diffusion 80 is placed a distance that the gate length of the NMOS FET from the third N$^+$ diffusion 70. The fourth N$^+$ diffusion 80 forms the drain for the NMOS FET and the collector of the parasitic BJT 150. The base of the parasitic BJT 150 is the P-type substrate 5 that is in the channel area of the NMOS FET.

The resistance 140 is formed by the bulk resistance of the P-type substrate 5 from the base of the parasitic BJT 150 to the P$^+$ diffusion 10b of the guardring.

The drain of the NMOS FET (the collector of the parasitic BJT 150) is connected to the diffusion resistor 50, and the diffusion resistor 50 is connected to the input 30.

When an ESD voltage source 200 such as an electrostatically charged object like the human body with a magnitude that is less than 2000 volts comes in contact with the input terminal 30, the voltage is transferred to the collector (the second N$^+$ diffusion 60) of the field device 100 and the field device 110 and through resistor 50 to the drain 80 of the NMOS FET. As the voltage exceeds the MOS FET drain break down voltage, that is limited by the gate oxide 95 thickness, a large number of electron-hole pairs are generated. This causes a large current created by the flow of the holes to be passed into the P-type substrate 5. The hole current in the P-type substrate 5 passes through the resistances 120 130 and 140. The voltage developed across the resistances 120 and 130 is sufficiently large as to forward bias the base-emitter junctions of the field devices 100, 110 and the parasitic BJT 150. The emitters formed by the first and third N$^+$ diffusions 20, 70 inject electrons to the collector of the field devices 100 and 110 and the parasitic BJT 150 formed by N$^+$ diffusions 60 and 80 respectively. The injected electrons accelerate because of the high voltage fields at the collector of the field devices (N$^+$ diffusion 60) and create more electron-hole pairs. This creates a feedback phenomena that sustains the conduction of the field devices 100 and 110.

When the field devices 100 and 110 are starting to conduct, the base resistances for the field device 100 is composed of the bulk resistance 120, while the base resistance of the field device 110 is composed of the series combination of bulk resistances 130 and 120. This forces the base current of the field device 100 to be larger than the base current of the field device 110.

Because the collectors are at equal potential and the base current of field device 100 is larger than the base current of field device 110, the collector current of field device 100 is very much larger than the collector current of field device 110. In fact, if the bulk resistances 120 and 130 are sufficiently large, field device 110 may not be conducting any current. This difference in currents is such that most if not all of the current from the ESD voltage source will pass through field device 100 creating sufficiently large current densities in the field device as to cause failure. This imbalance of current carrying capability of the field devices 100 110 is known as the current crowding effect.

In order to limit the current passing through the NMOS FET during the ESD discharge, a resistor 50 is connected from the second diffusion 60 (the collectors of field devices 100 and 110) and the input terminal 30 to the ground reference potential 40.

Other descriptions of related devices for improved ESD immunity have been described in a paper by Chatterjee and Polgreen in the IEEE 1990 Symposium on VLSI Technology, Pages 75–76, entitled "A low Voltage Triggering SCR for Chip ESD Protection at Output and Input Pads" and a paper by Roundtree in the 1988 IEDM Technical Digest pages 580–583 entitled "ESD Protection for Submicron CMOS Circuits, Issues and Solutions". Ker et. al. U.S. Pat. No. 5,140,401 and Ker et. al. U.S. Pat. No. 5,182,220 teach techniques for the formation of SCR's within highly dense CMOS circuit fabrication taking advantage of the parasitic devices inherent in the process.

SUMMARY OF THE INVENTION

An object of this invention is the creation of an input protection circuit that will protect highly dense CMOS integrated circuits from device failure due to excessive voltage and current from ESD sources. The input protection circuit has a first P$^+$ diffusion that is the guardring that circumscribes the boundary defining the area of the input protection circuit. An input terminal connects the input protection circuit to other circuitry and to an input pad of a highly dense integrated circuit chip.

Within the input protection circuit, the input terminal is connected to an N$^+$ diffusion that is the collector of a first field device and second field device. Two more N+ diffusions are placed a distance that is the width of the bases of the first and second field devices from the N+ diffusion that is the collector of the first and second field devices. These N+ diffusions are the emitters of the first and second field devices. The emitters of the first and second field devices are connected to a ground reference potential as is the guardring. The bases of the first and second field devices are formed by the P-type substrate onto which the input protection circuit is placed.

Connected from the base of the first field device to a second P+ diffusion that is adjacent to the N+ diffusion of the emitter of the first field device is a resistance that is formed by the bulk resistance of the P-type substrate. The second P+ diffusion is connected to the ground reference potential.

Adjacent to the second P+ diffusion and on the side opposite the third N+ diffusion of the emitter of the first field device is a fourth N+ diffusion that is the source of an NMOS FET. A polysilicon layer forms the gate of the NMOS FET is adjacent to the fourth N+ diffusion and isolated from the P-type substrate by a layer of insulating material. A fifth N+ diffusion is placed a distance that is the length of the gate from the fourth N+ diffusion and forms the drain of the NMOS FET.

A parasitic BJT is formed by the fourth N+ diffusion, the P-type substrate area beneath the gate of the NMOS FET, and the fifth N+ diffusion. The emitter of the parasitic BJT is the source of the NMOS FET, the gate is the P-type substrate beneath the gate of the NMOS FET, and the collector is the drain of the NMOS FET.

The source and gateof the NMOS FET are connected to the ground reference potential. The drain of the NMOS FET is connected to a diffusion resistor. The diffusion resistor is connected to the input.

Connected from the base of the second field device to the guardring is a second resistance that is formed by another area of bulk resistance of the P-type substrate.

A resistor is connected from the collectors of the first and second field devices drain of the drain of the NMOS FET, so as to limit the current from an ESD voltage source that is contacted to the input terminal.

The physical structures of the first and second field devices and the configuration of the two bulk resistances allow the first and second field devices to conduct nearly simultaneously and equally when the input terminal is brought in contact with an ESD voltage source. This structure will allow for greater immunity to failure from ESD events.

BRIEF DESCRIPTION OF THE FIGURES

FIG. 1a illustrates a top view of an input protection circuit of prior art.

FIG. 1b illustrates a cross sectional view of the prior art with the equivalent circuit connections.

DETAILED DESCRIPTION OF THE INVENTION

Figure 2A:
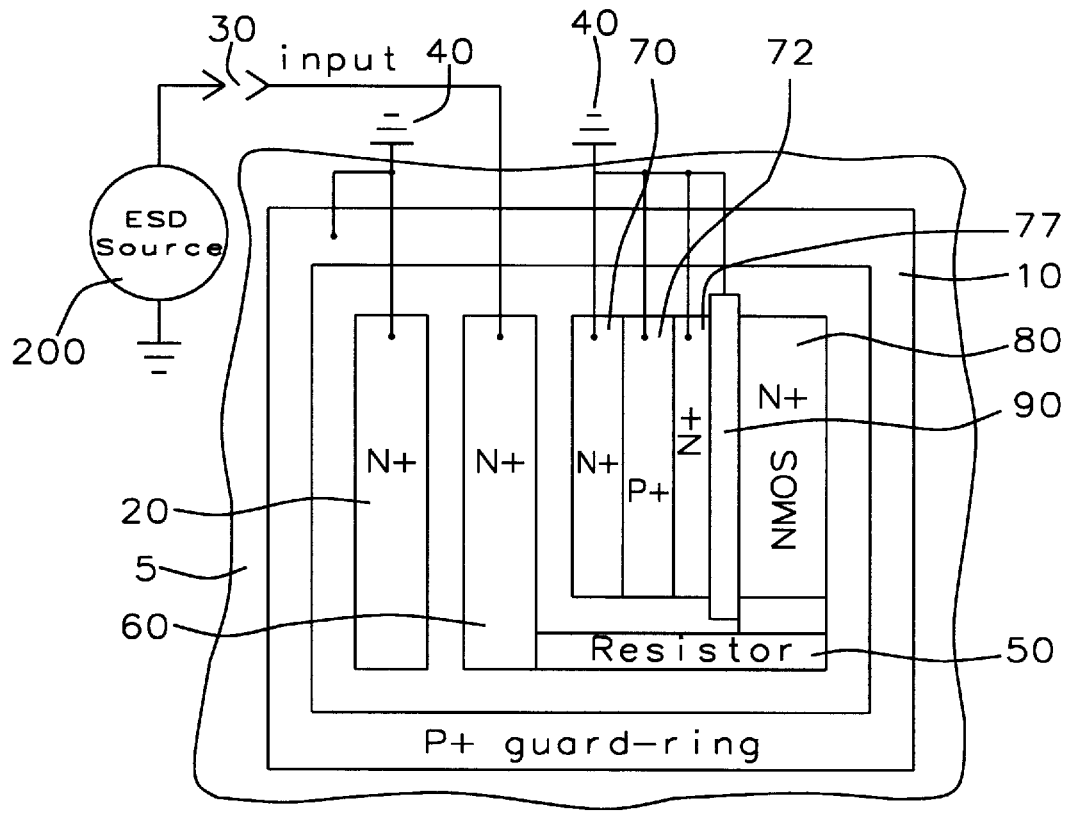
FIG. 2a illustrates the top view of an input protection circuit of this invention.
Figure 2B:
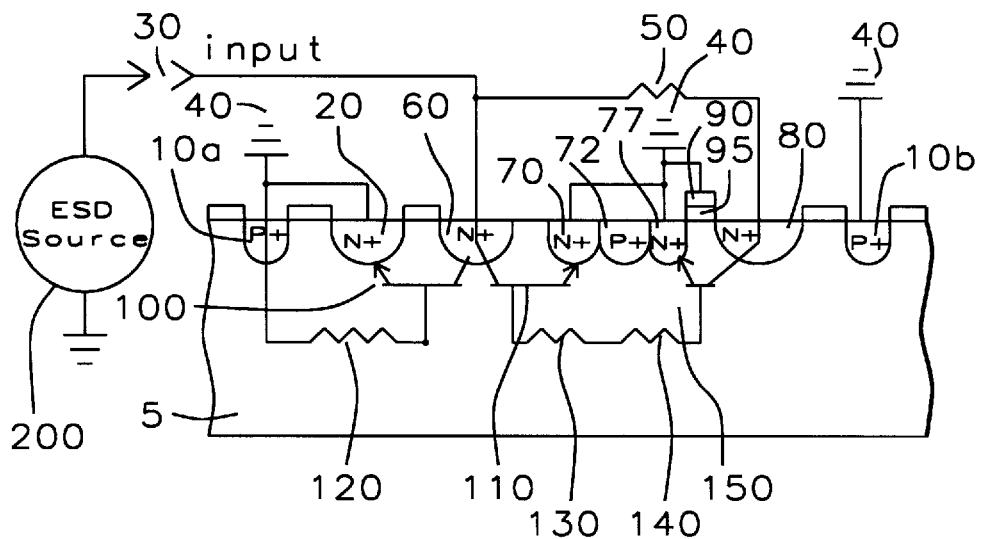
FIG. 2b illustrates the cross sectional view of an input protection circuit of this invention with the equivalent circuit connections.
Figure 2A:
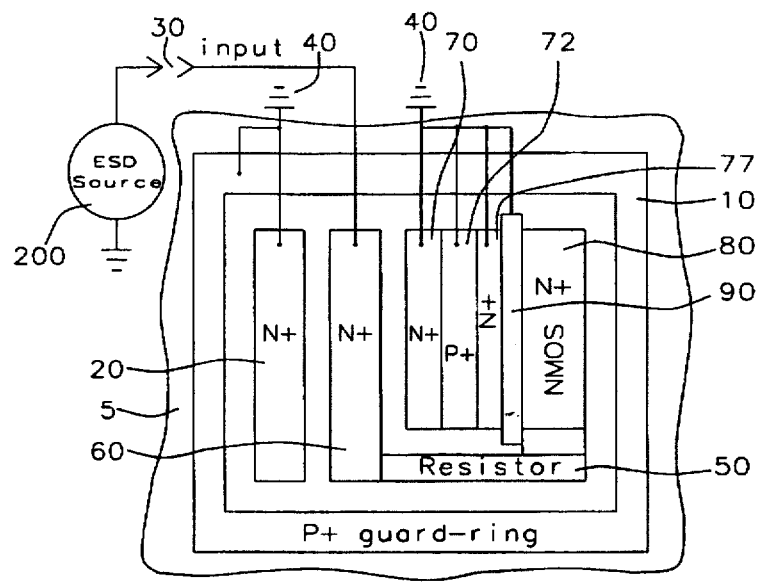
Figure 2B:
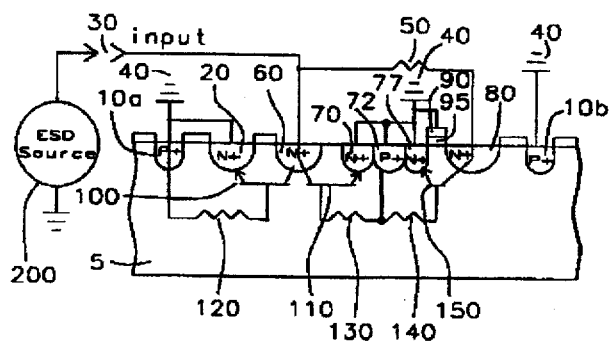

Referring to FIGS. 2a and 2b, as in the prior art, a P+ diffusion 10 that circumscribes the area of the input protection circuit is placed on the P-type substrate 5. The field devices 100 and 110 are defined by the N+ diffusions 20, 60, and 70, also as in the prior art. The base resistance 120, again as in the prior art, is defined by the bulk resistance of the P-type substrate 5 between the base of the field device 100 and the guardring 10a which is connected to the ground reference potential 40. In this invention the base resistance 130 is defined by the bulk resistance of the P-type substrate 5 from the base of the field device 110 and a second P diffusion 72 that is placed adjacent to the N+ diffusion 70 that is the emitter of the field device 110.

The source of the NMOS FET and its parasitic BJT 150 is now the N+ diffusion 77 placed adjacent to the second P+ diffusion 72. Each of the N+ diffusions 70 and 77 and the second P+ diffusion 72 are connected to the ground reference potential 40. The structure of the NMOS FET and its parasitic BJT 150 are identical to the prior art.

The resistance 140 is formed by the bulk resistance of the P-type substrate 5 from the base of the parasitic BJT 150 to the second P+ diffusion 72.

A resistor is placed from the collector of the field devices 100 and 110 (the N+ diffusion 60) and the drain of the NMOS FET.

When an ESD voltage source 200, that may be an electrostatically charged object such as a human body with a magnitude of greater than 2000 volts, makes contact with the input terminal 30, the ESD voltage is transferred to the collectors of the field devices 100 and 110 and through the resistor 50 to the drain 80 of the NMOS FET. As the voltage exceeds the MOS FET drain break down voltage, that is limited by the gate oxide 95 thickness, a large number of electron-hole pairs are generated, as in the prior art. The difference from the prior art is that in the present invention the base resistance 130 of field device 110 is connected to a shorter path through the second P+ diffusion 72 to the ground reference potential 40. This shorter path makes the base resistance for the field devices 100 and 110 approximately equal and the voltage developed at the base of the field devices 100 and 110 also approximately equal. This allows the currents through both field devices 100 and 110 to be approximately equal. Since now the current from the ESD source 200 is conducted evenly through both field devices 100 and 110, the current crowding effect into one device is eliminated and the current density in the field devices 100 and 110 is of a level as to minimize the risk of device failure and increasing the voltage level of the ESD voltage source 200 necessary to cause failure.

Other Embodiments

The device described in FIGS. 2a and 2b can be implemented in an equivalent structure having an N substrate and a p-well diffusion. This structure of FIGS. 2a and 2b can also equivalently be implemented as a PNP field device in an N substrate or an N-well on a P substrate by the adjusting of the conductivity and polarity of the semiconductor materials. This device structure can also be implemented in integrated circuit designs implementing PNP bipolar transistor designs. Those skilled in the art will recognize the variations in the descriptions as within the art and intended scope of the claims.

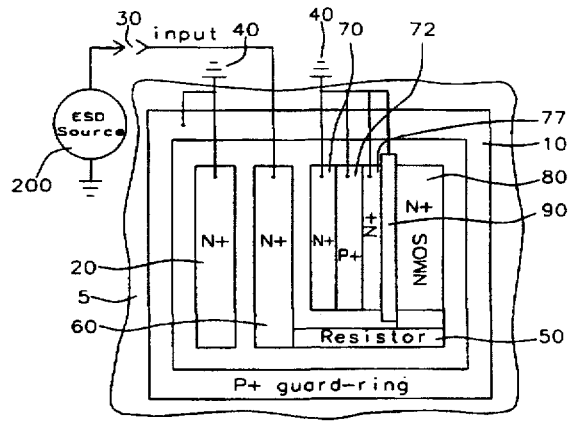

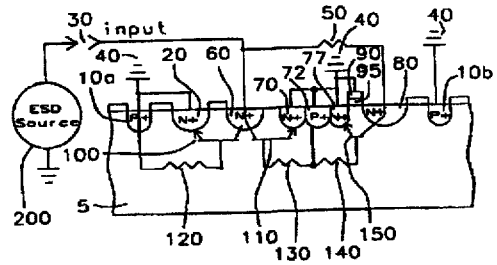

What is claimed is:

1. An input protection circuit for improved ESD protection comprising:

a) an input terminal for the coupling of said input protection circuit to other circuitry;

b) a ground reference potential;

c) an NMOS FET comprising a gate, source, and drain;
d) a resistor connected between the input terminal and the drain of the NMOS FET;
e) a parasitic bipolar junction transistor comprising an emitter, a base, and a collector, wherein the emitter is the source of the NMOS FET and the collector is the drain of the NMOS FET;
f) a first field device comprising an emitter, base, and collector;
g) a second field device comprising an emitter, base, and collector;
h) a first bulk resistance connected between the base of the first field device and the ground reference potential;
i) a second bulk resistance connected between the base of the second field device and the ground reference potential, and in parallel with the first bulk resistance; and
j) a third bulk resistance connected between the base of the parasitic bipolar junction transistor and the ground reference potential, and in parallel with the first and second bulk resistances.

2. The input protection circuit of claim 1 wherein the collectors of the first and second field devices are connected to the input terminal.

3. The input protection circuit of claim 1 wherein the first field device further comprises a base-collector junction formed at the boundary between the base and collector of said first field device.

4. The input protection circuit of claim 1 wherein the first field device further comprises a base-emitter junction formed at the boundary between the base and emitter of said first field device.

5. The input protection circuit of claim 1 wherein the second field device further comprises a base-collector junction formed at the boundary between the base and collector of said second field device.

6. The input protection circuit of claim 1 wherein the second field device further comprises a base-emitter junction formed at the boundary between the base and emitter of said second field device.

7. The input protection circuit of claim 1 wherein the emitters of the first and second field devices are connected to the ground reference potential.

8. The input protection circuit of claim 1 wherein an ESD voltage source such as an electrostatically charged object is made to instantaneously contact to the input terminal.

9. The input protection circuit of claim 8 wherein the voltage of the ESD source is of the magnitude of 2000 volts or greater.

10. The input protection circuit of claim 8 wherein the contacting of the ESD source to the input terminal transfers the voltage of the ESD source to the collectors of the first and second field devices and through the resistor to the drain of the NMOS FET.

11. The input protection circuit of claim 10 wherein a junction formed between the drain that is also the collector of the parasitic bipolar junction transistor and the base of the parasitic bipolar junction transistor enters into avalanche breakdown when the voltage at the drain of the NMOS FET is sufficiently large.

12. The input protection circuit of claim 11 wherein the avalanche breakdown generates a sufficiently large magnitude of holes to pass through the first and second and third bulk resistances, so as a voltage developed across the first and second bulk resistances is sufficiently large as to cause the base emitter junctions of the first and second field devices to start to conduct thus starting the first and second field devices to begin to conduct adequately to cause the ESD source to be discharged thus preventing damage to the other circuitry.

13. The input protection circuit of claim 1 wherein the resistor will limit the conduction of the NMOS FET during the contacting of the ESD source to the input terminal.

14. An integrated circuit structure for the implementation of the input protection circuit for improved ESD protection comprising:
a) an area of P-type semiconductor substrate onto which said group of integrated circuit devices is fabricated and having a property of bulk resistance;
b) a first $P^+$ diffusion circumscribing an area of a guardring that defines the group of integrated circuits;
c) a first $N^+$ diffusion in a rectangular form placed centrally with in the guardring and forming an emitter of a first field device of an input protection circuit;
d) a second $N^+$ diffusion in a rectangular form placed a distance that is a width of a base of the first field device of the input protection circuit from the first $N^+$ diffusion and forming collectors of the first and a second field device of the input protection circuit;
e) a third $N^+$ diffusion in a rectangular form placed a distance that is a width of a base of the second field device from the second $N^+$ diffusion and forming the emitter of the second field device of the input protection circuit;
f) a second $P^+$ diffusion in a rectangular form placed adjacent to the third $N^+$ diffusion and on the side opposite the second $N^+$ diffusion;
g) an NMOS FET comprising a gate, drain, and source;
h) a parasitic bipolar junction transistor comprising an emitter, a base, and a collector, wherein the emitter is the source of the NMOS FET, the base is the P-type substrate in the gate area of the NMOS FET, and the collector is the drain of the NMOS FET;
i) a resistor connected between the drain of the NMOS FET and the second $N^+$ diffusion;
j) a fourth $N^+$ diffusion in a rectangular form placed adjacent to the second $P^+$ diffusion on the side opposite the first $N^+$ diffusion and forming the source of the NMOS FET;
k) a polysilicon layer that is the gate of the NMOS FET in a rectangular form placed adjacent to the fourth $N^+$ diffusion on the side opposite the second $P^+$ diffusion;
l) a fifth $N^+$ diffusion in a rectangular form placed a width of a gate from the fourth $N^+$ diffusion and is the drain of the NMOS FET;
m) a ground reference potential connected to each side of the rectangular guardring, the first $N^+$ diffusion, the third $N^+$ diffusion, the second $P^+$ diffusion, the fourth $N^+$ diffusion, the fifth $N^+$ diffusion, and the polysilicon layer;
n) an input terminal connected to the second $N^+$ diffusion;
o) a first resistance formed by the bulk resistance of the P-type substrate from the area of the base of the first field device to the second $P^+$ diffusion;
p) a second resistance formed by the bulk resistance of the P-type substrate from the area of the base of the second field device to the guardring; and
q) a third resistance formed by the bulk resistance of the P-type substrate from the area of the base of the parasitic bipolar junction transistor to the second $P^+$ diffusion.

15. The integrated circuit structure of claim 14 wherein an ESD voltage source such as an electrostatically charged object is made to instantaneously contact to the input terminal.

16. The integrated circuit structure of claim 15 wherein the voltage of the ESD source is of the magnitude of 2000 volts or greater.

17. The integrated circuit structure of claim 15 wherein the contacting of the ESD source to the input terminal transfers the voltage of the ESD source to the second $N^+$ diffusion and through the resistor to the drain of the NMOS FET.

18. The integrated circuit structure of claim 17 wherein the junction formed at drain of the NMOS FET that is also the collector of the parasitic bipolar transistor and the P-type substrate enters into avalanche breakdown, which generates a sufficiently large magnitude of holes to pass through the first second and third bulk resistances, wherein a voltage developed across the first and second bulk resistances is sufficiently large as to cause a junction formed at the boundary of the first $N^+$ diffusion and the P-type substrate and a junction formed at the boundary of the third $N^+$ diffusion and the P-type substrate to conduct thus starting the first and second field devices to begin to conduct, whereby the conduction of the first and second field devices is adequate to cause the ESD source to be discharged thus preventing damage to the other circuitry.

19. The integrated circuit structure of claim 14 wherein the resistor will limit the conduction of the NMOS FET during the contacting of the ESD source to the input terminal.

* * * * *

UNITED STATES PATENT AND TRADEMARK OFFICE
CERTIFICATE OF CORRECTION

Page 1 of 3

PATENT NO. : 5,811,856
DATED : Sept. 22. 1998
INVENTOR(S) : Lee

It is certified that error appears in the above-identified patent and that said Letters Patent is hereby corrected as shown below:

The Title page showing the illustrative figure, should be deleted and substitute therefore the attached Title page.

Delete drawing sheet 2, and subtitute therefore drawing sheet consisting of Figs. 2A and 2B, as shown on attached pages.

Signed and Sealed this

Twenty-second Day of February, 2000

Attest:

Q. TODD DICKINSON

*Attesting Officer*     *Commissioner of Patents and Trademarks*

United States Patent [19]

Lee

[11] Patent Number: 5,811,856
[45] Date of Patent: Sep. 22, 1998

[54] LAYOUT OF ESD INPUT-PROTECTION CIRCUIT

[75] Inventor: Jian-Hsing Lee, Hsin-Chu, Taiwan

[73] Assignee: Taiwan Semiconductor Manufacturing Company, Ltd., Hsin-Chu, Taiwan

[21] Appl. No.: 554,994

[22] Filed: Nov. 13, 1995

[51] Int. Cl.⁶ ................................................. H01L 23/62
[52] U.S. Cl. ........................ 257/355; 257/361; 257/360; 257/363
[58] Field of Search ........................... 257/355, 361, 257/362, 360, 363

[56] References Cited

U.S. PATENT DOCUMENTS

| 5,140,401 | 8/1992 | Ker et al. | 357/43 |
| 5,151,767 | 9/1992 | Wong | 257/355 |
| 5,182,220 | 1/1993 | Ker et al. | 437/34 |
| 5,623,156 | 4/1997 | Watt | 257/355 |

OTHER PUBLICATIONS

"A Low Voltage Triggering SCR for Chip ESD Protection at Output & Input Pads" by Chitterjee et al, IEEE 1990, Symposium on VLSI Tech. pp. 75–76.

"ESD Protection for Submicron CMOS Circuits, Issues and Solutions", by Rountree in 1988 IEDM Technical Digest, pp. 580–583.

Primary Examiner—David B. Hardy
Attorney, Agent, or Firm—George O. Saile; Stephen B. Ackerman

[57] ABSTRACT

An object of this invention is the creation of an input protection circuit for highly dense integrated circuits that has improved ESD immunity. This is accomplished by the addition of a P⁺ diffusion adjacent to the emitter of a field device to make the base resistance of each of the field devices approximately equal. When an ESD source is contacted to the input protection circuit, the field devices will conduct simultaneously and with equal currents, thus preventing high current densities that can cause circuit failure.

19 Claims, 2 Drawing Sheets